United States Patent
Igawa et al.

(10) Patent No.: US 10,116,118 B2
(45) Date of Patent: Oct. 30, 2018

(54) OPTICAL TRANSMITTER AND SEMICONDUCTOR LASER TEMPERATURE CONTROL METHOD

(71) Applicant: Mitsubishi Electric Corporation, Chiyoda-ku (JP)

(72) Inventors: Eitetsu Igawa, Chiyoda-ku (JP); Satoshi Ishitobi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/302,125

(22) PCT Filed: Feb. 3, 2015

(86) PCT No.: PCT/JP2015/052989
§ 371 (c)(1),
(2) Date: Oct. 5, 2016

(87) PCT Pub. No.: WO2015/162964
PCT Pub. Date: Oct. 29, 2015

(65) Prior Publication Data
US 2017/0207602 A1    Jul. 20, 2017

(30) Foreign Application Priority Data
Apr. 21, 2014 (JP) ................... 2014-087461

(51) Int. Cl.
*H01S 5/024* (2006.01)
*H01S 5/0683* (2006.01)
(Continued)

(52) U.S. Cl.
CPC ........ *H01S 5/02407* (2013.01); *H01S 5/0014* (2013.01); *H01S 5/0683* (2013.01);
(Continued)

(58) Field of Classification Search
CPC ...... H01S 5/02407; H01S 5/0014; H01S 3/04; H01S 3/1317; H01S 5/02453; H01S 3/1028
(Continued)

(56) References Cited

U.S. PATENT DOCUMENTS 6,195,370 B1    2/2001 Haneda et al.
6,291,813 B1 *  9/2001 Ackerman ............ H01S 5/0687
                                                        250/214 R
(Continued)

FOREIGN PATENT DOCUMENTS

CN    101404376 A    4/2009
JP    05-241668    *    9/1993
(Continued)

OTHER PUBLICATIONS

International Search Report dated Apr. 28, 2015, in PCT/JP2015/052989 filed Feb. 3, 2015.
(Continued)

*Primary Examiner* — Tuan Nguyen
(74) *Attorney, Agent, or Firm* — Oblon, McClelland, Maier & Neustadt, L.L.P.

(57) ABSTRACT

An optical transmitter includes a semiconductor laser, a thermoelement that is connected with the semiconductor laser and that heats or cools the semiconductor laser, a thermistor that detects the temperature of the semiconductor laser via the thermoelement, a laser drive circuit that drives the semiconductor laser, a thermoelement driving circuit that acquires information about the temperature of the semiconductor laser from the thermistor, and that controls a current flowing through the thermoelement in such a way that the temperature detected by the thermistor becomes equal to a set value, and a controller that varies the set value on the basis of monitor current information outputted from the (Continued)

semiconductor laser, the temperature information about the semiconductor laser which is notified from the thermistor, and laser driving current information notified from the laser drive circuit.

4 Claims, 3 Drawing Sheets

(51) Int. Cl.
  *H01S 5/00* (2006.01)
  *H01S 5/068* (2006.01)
  *H01S 5/06* (2006.01)
(52) U.S. Cl.
  CPC ........ *H01S 5/06804* (2013.01); *H01S 5/0617* (2013.01); *H05K 999/99* (2013.01)
(58) Field of Classification Search
  USPC ..... 372/34, 38.02, 29.021; 398/22, 136, 138
  See application file for complete search history.

(56) References Cited

U.S. PATENT DOCUMENTS

| | | | | |
|---|---|---|---|---|
| 6,400,737 | B1* | 6/2002 | Broutin | H01S 5/0687 372/20 |
| 2003/0152390 | A1* | 8/2003 | Stewart | H04B 10/07957 398/135 |
| 2004/0114646 | A1* | 6/2004 | Stewart | H01S 5/0612 372/34 |
| 2006/0159141 | A1* | 7/2006 | Uchida | H01S 5/02415 372/34 |

FOREIGN PATENT DOCUMENTS

| | | | |
|---|---|---|---|
| JP | 5-241668 A | | 9/1993 |
| JP | 2001-144369 | * | 5/2001 |
| JP | 2001-144369 A | | 5/2001 |
| JP | 2011-144369 | * | 5/2001 |
| JP | 2002-158383 | * | 5/2002 |
| JP | 2002-158383 A | | 5/2002 |
| JP | 2006-202992 | * | 8/2006 |
| JP | 2006-202992 A | | 8/2006 |
| WO | WO 99/14832 | * | 3/1999 |
| WO | WO 99/14832 A1 | | 3/1999 |

OTHER PUBLICATIONS

Korean Office Action dated Nov. 21, 2017 in Korean Patent Application No. 10-2016-7032062 (with English translation).
Office Action dated Dec. 5, 2017 in Japanese Patent Application No. 2016-514743 with unedited computer generated English translation.
Office Action dated Jul. 4, 2018 in Chinese Patent Application No., 201580020995.0, citing document AO therein, with English-language translation, 18 pages.

* cited by examiner

OPTICAL TRANSMITTER AND SEMICONDUCTOR LASER TEMPERATURE CONTROL METHOD

TECHNICAL FIELD

The present invention relates to an optical transmitter for and a semiconductor laser temperature control method of, in an optical transport system, controlling a heat conductive element that is disposed to keep a semiconductor laser at a constant temperature and represented by a Peltier device, and that heats or cools the semiconductor laser by using a current.

BACKGROUND ART

In an optical transmitter, in order to prevent decrease in the current-light conversion efficiency (slope efficiency) of a semiconductor laser used for the optical transmitter due to a temperature rise, and prevent a wavelength shift due to the temperature, a thermoelement that is represented by a Peltier device or the like and that heats or cools the semiconductor laser by using a current, and a TEC (Thermo-Electric Cooler) controller that controls the thermoelement are typically disposed to keep the semiconductor laser at a constant temperature in conventional temperature control using the TEC controller, the temperature at which to drive the semiconductor laser is determined, the current temperature information about the semiconductor laser is read by a temperature sensor such as a thermistor, information including a current, a voltage and so on, which correspond to the temperature, is fed back to the TEC controller, and the TEC controller controls the temperature of the thermoelement (i.e., the temperature of the semiconductor laser) in such a way that the current, the voltage and so on are kept constant.

Further, for example, patent literature 1 discloses a thermal control circuit in which a laser diode is disposed as a pumping light source, and a heating/cooling discrimination circuit acquires a high-low relationship between a temperature detected by a temperature detector and a target temperature set arbitrarily, and a control block controls the time ratio of ON/OFF of a current for driving a control element on the basis of this high-low relationship in such a way that the temperature of the control element becomes equal to the target temperature.

CITATION LIST

Patent Literature

Patent Literature 1: Japanese Unexamined Patent Application Publication No. Hei 5-241668

SUMMARY OF INVENTION

Technical Problem

In general, semiconductor lasers have characteristics having various patterns of temperature dependence such as temperature dependence such that their oscillation wavelengths shift dependently upon their temperatures. In order to remove this temperature dependence, by using a thermoelement, such as a Peltier element, and a TEC controller, as mentioned above, temperature control is carried out in such a way that all modules are fundamentally kept at a fixed set temperature (Tld). The set temperature (Tld) is limited to some extent by a range of temperatures in which the slope efficiency of the laser can be ensured to be adequate, and to which all the modules can be heated or cooled by the thermoelement with respect to the highest and lowest ones of the possible operating temperatures of the device. For example, when Tld is set to a low value, a large amount of current is consumed at high temperatures. In contrast, when Tld is set to a high value, a large amount of current is consumed at low temperatures because of heating.

For example, a typical semiconductor laser has a characteristic that its efficiency (slope efficiency) in converting the current flowing through the semiconductor laser into light is high low temperatures and low at high temperatures. However, there are various patterns of the decrease in the efficiency of conversion of the current into light at high temperatures, depending on semiconductor lasers. Therefore, some semiconductor lasers emit light beams efficiently even at high temperatures. More specifically, there is a case in which desired power can be outputted even when Tld of a semiconductor laser whose temperature is controlled by a thermoelement is set to be higher than those of standard lasers.

A problem with conventional techniques is that because semiconductor lasers are controlled in such a way that their temperatures become equal to a fixed temperature Tld regardless of whether or not their temperature characteristics as mentioned above are good, even if, for example, a semiconductor laser has good characteristics at high temperatures, the temperature of the semiconductor laser is controlled to the fixed one and hence a large amount of current flowing through the current element is also consumed, and the temperature control is thus carried out using the useless power consumption.

The present invention is made in order to solve the above-mentioned problem, and it is therefore an object of the present invention to provide an optical transmitter and a semiconductor laser temperature control method capable of adjusting Tld to an optimum value for each semiconductor laser or for each operating condition, minimizing a current flowing through a thermoelement, and achieving low power consumption of an optical transmission and reception unit.

Solution to Problem

According to the present invention, there is provided an optical transmitter including: a semiconductor laser; a thermoelement connected with the semiconductor laser, to heat or cool the semiconductor laser a thermistor to detect the temperature of the semiconductor laser via the thermoelement; a laser drive circuit to drive the semiconductor laser; a thermoelement driving circuit to acquire information about the temperature of the semiconductor laser from the thermistor, and to control a current flowing through the thermoelement in such a way that the temperature detected by the thermistor becomes equal to a set value and a controller to vary the set value on the basis of a monitor current outputted from the semiconductor laser, the temperature information about the semiconductor laser which is notified from the thermistor, and laser driving current information notified from the laser drive circuit.

Advantageous Effects of Invention

According to the present invention, Tld can be adjusted to an optimum value for each semiconductor laser or for each operating condition, the current flowing through the thermoelement can be minimized, and low power consumption of an optical transmission and reception unit can be achieved.

DESCRIPTION OF EMBODIMENTS

Hereafter, the preferred embodiments of the present invention will be explained in detail with reference to the drawings.

Embodiment 1

Figure 1:
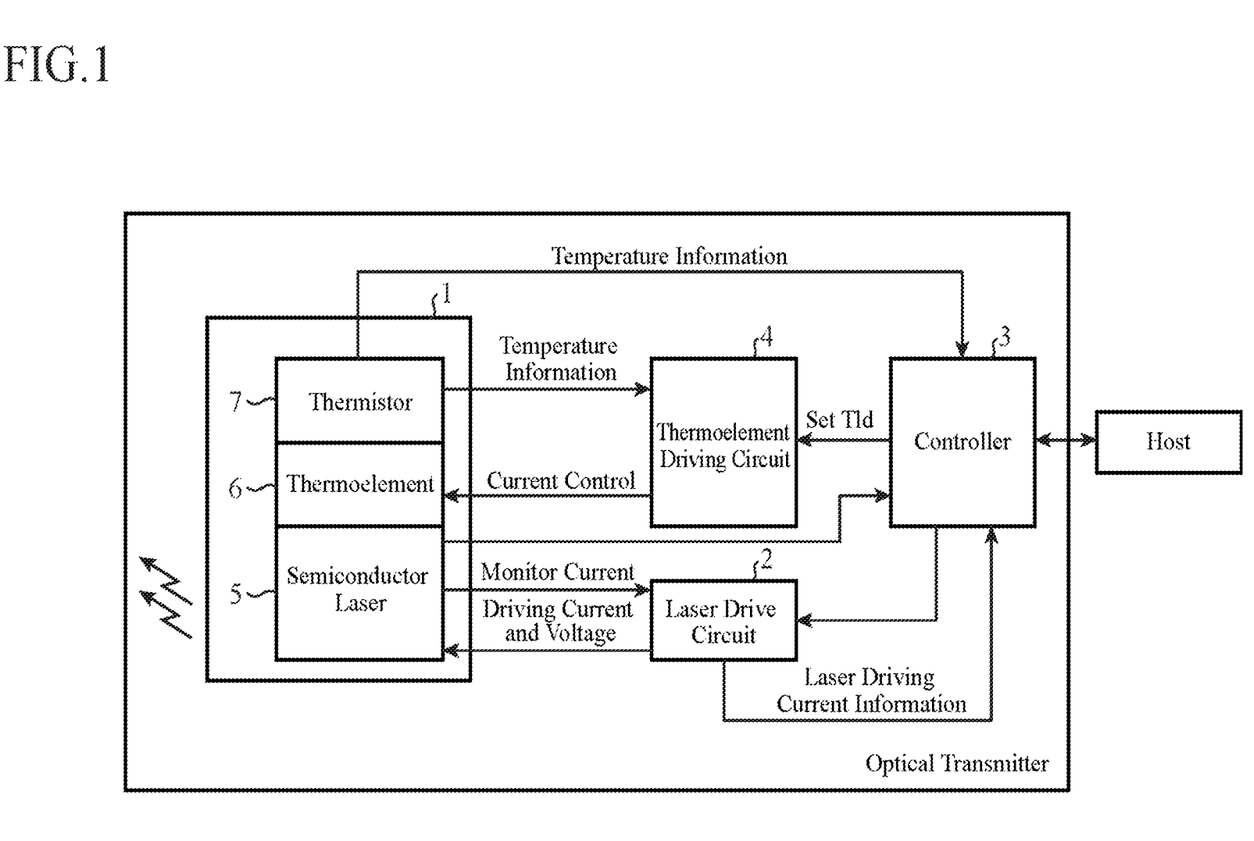
FIG. 1 is a block diagram of an optical transmitter according to Embodiment 1 of the present invention.

FIG. 1 is a block diagram of an optical transmitter according to Embodiment 1 of the present invention.

As shown in FIG. 1, the optical transmitter is provided with a semiconductor laser unit 1, a laser drive circuit 2, a controller 3, and a thermoelement driving circuit 4. The semiconductor laser unit 1 is comprised of a semiconductor laser 5, a thermoelement 6, and a thermistor 7.

The semiconductor laser 5 emits light or stops emitting light dependently on a current from the laser drive circuit 2. The semiconductor laser 5 also notifies information about its own emission power, as a monitor current, to the laser drive circuit 2 and the controller. The controller 3 can notify the state of the semiconductor laser to a host by analog-to-digital converting and holding the information.

The monitor current is typically generated by a monitor PD which is an optical receiving element for monitoring an element whose current amount varies dependently on the light power received thereby) installed while being paired up with the semiconductor laser 5. The monitor PD is typically installed on a rear surface opposite to the light-emitting surface of the semiconductor laser 5, and implements an operation of increasing or decreasing the monitor current dependently on the amount of light emitted from the semiconductor laser 5.

The thermoelement 6 is connected with the semiconductor laser 5, and heats or cools the semiconductor laser 5 under current control by the thermoelement driving circuit 4.

The thermistor 7 detects the temperature of the thermoelement 6 and notifies information about the temperature to the thermoelement driving circuit 4. The temperature of the thermoelement 6 is referred to at the time of performing control in such a way that the temperature of the semiconductor laser 5 becomes equal to a set temperature (Tld). The thermistor 7 also notifies the temperature information, as monitor information, to the controller 3.

The laser drive circuit 2 controls a driving current flowing through the semiconductor laser 5 of the semiconductor laser unit 1 in accordance with data which the laser drive circuit receives from the host via the controller 3, to drive the semiconductor laser 5. The laser drive circuit 2 also notifies laser driving current information set thereby to the controller 3.

The controller 3 monitors the temperature information from the thermistor 7 of the semiconductor laser unit 1, the monitor current from the semiconductor laser 5, and the laser driving current information from the laser drive circuit 2, and controls Tld in accordance with the pieces of information monitored thereby in such a way that Tld becomes close to ambient temperature as close as possible, while holding the characteristics of an optical transmission and reception unit. In this Embodiment 1, the ambient temperature is the temperature of the thermoelement 6 which the thermistor 7 detects in the temperature control on the semiconductor laser 5 of the optical transmitter.

The thermoelement driving circuit 4 controls the current flowing through the thermoelement 6 on the basis of the temperature information notified from the thermistor 7 in such a way that the ambient temperature becomes equal to Tld set by the controller 3.

In Embodiment 1 of the present invention, it is assumed that the monitor information about the semiconductor laser 5 (the emitted light power and the information about the driving current) is monitored by a function such as DDM Digital Diagnostics Monitoring).

Figure 2:
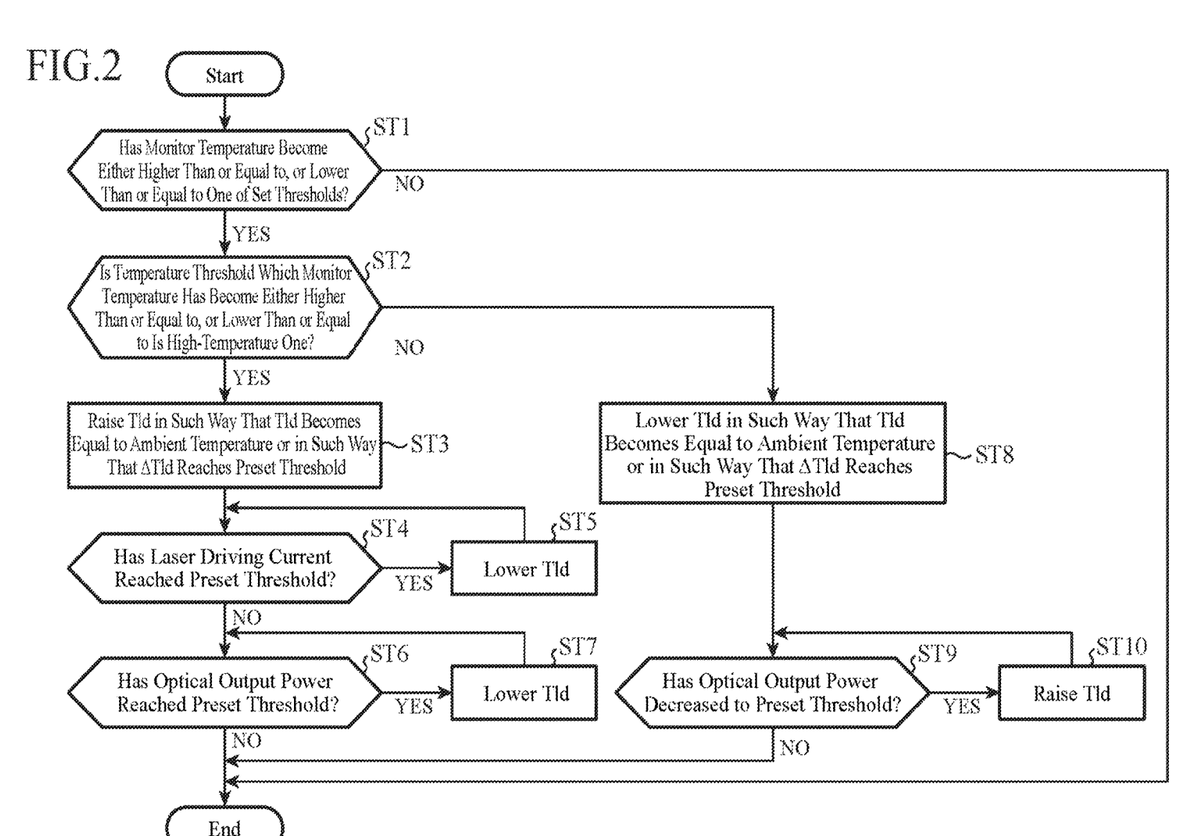
FIG. 2 is a flow chart explaining an example of an operation of controlling temperature which is performed by a controller according to Embodiment 1 of the present invention.

FIG. 2 is a flow chart explaining an example of the temperature control operation performed by the controller 3 according to Embodiment 1 of the present invention.

Here, as a method of controlling the optical output power of the optical transmitter, a feed-back APC (Automatic Power Control) method is used for the optical transmitter.

There can be a premise that, as an environment in which the optical receiver according to Embodiment 1 of the present invention acts effectively, there is a case in which there is a large difference between the temperature of the optical transmitter, i.e., the ambient temperature and set temperature Tld. Therefore, in this Embodiment 1, it is assumed that temperature thresholds, at each of which the control of Tld by the optical transmitter according to Embodiment 1 of the present invention is implemented, are set in advance and held in the controller 3 as information.

First, the controller 3 monitors the current temperature on the basis of the monitor temperature based on the temperature information from the thermistor 7, and determines whether or not the current temperature has become either higher than or equal to the preset high-temperature threshold, or lower than or equal to the preset low-temperature threshold (in step ST1). More specifically, the controller 3 determines whether to carry out either a control operation on a high temperature side or a control operation on a low temperature side. In this embodiment, although the thresholds are set for the monitor temperature itself, this embodiment is not limited to this example. Thresholds can be alternatively set in advance for the difference between the temperature monitor value and Tld, and the determination can be carried out by determining whether or not the difference between the temperature monitor value and Tld has become either larger than or equal to one of the thresholds, or smaller than or equal to the other threshold.

When, in step ST1, determining that the current temperature has become neither higher than or equal to the preset high-temperature threshold, nor lower than or equal to the preset low-temperature threshold (when "NO" in step ST1), the controller ends the processing without performing the control operation.

In contrast, when, in step ST1, determining that the current temperature has become either higher than or equal to the preset high-temperature threshold, or lower than or equal to the preset low-temperature threshold (when "YES" in step ST1), the controller 3 advances to step ST2 and starts the control operation.

More specifically, taking the control operation on the high temperature side as an example, when the preset high-temperature threshold is 50 degrees Celsius, the controller does not perform any control operation if the current monitor temperature is 49 degrees Celsius, but, when monitoring the current monitor temperature to be 50 degrees Celsius, the controller 3 starts the control operation.

The controller 3 determines whether or not the temperature threshold, which has been determined to be higher than or equal to, or lower than or equal to the threshold in step ST1, is on the high-teMperature side (in step ST2).

When, determining that the temperature threshold, which has been determined to be higher than or equal to, or lower than or equal to the threshold of step ST2, is on the high-temperature side (when "YES" in step ST2), the controller 3 raises Tld in such a way that Tld becomes equal to the ambient temperature or in such a way that a temperature ΔTld by which the thermoelement 6 must cool the semiconductor laser reaches a preset threshold (in step ST3).

Hereafter, the process of step ST3 will be explained in detail.

While it is necessary to "bring Tld close to the ambient temperature as close as possible" in order to produce a power saving effect, it is necessary to take the characteristic of the center wavelength into consideration at this time. It is defined that the center wavelength falls within a range of for example, 1,260 nm to 1,280 nm in accordance with the specifications, and has a property of varying with the temperature of the semiconductor laser 5 (e.g., 0.1 nm/degrees Celsius). Further, the optical output power characteristic of the semiconductor laser 5 may vary dependently upon the wavelength. In this embodiment, it is assumed that the center wavelength of the optical transmitter and the amount of variation depending on the temperature are set at the time of an initial adjustment test on the optical transmitter (however, results acquired at the time of the adjustment test are not necessarily used, and the center wavelength of the optical transmitter and the amount of variation depending on the temperature can be alternatively calculated from a distribution characteristic or the like). What is determined from the center wavelength of the optical transmitter and the amount of variation depending on the temperature is ΔTld which can be varied according to the specifications, i.e., an allowable variation amount of the center wavelength which corresponds to an allowable variation amount of ΔTld. Therefore, the controller 3 determines whether ΔTld has reached the preset threshold.

At this time, when it is assumed that, for example, the allowable variation amount of the center wavelength of the semiconductor laser the allowable variation amount of ΔTld) is 2 nm which corresponds to 20 degrees Celsius, because the power con consumption is the lowest under the condition that Tld=the ambient temperature, there is a case in which there exists a condition under which the power consumption is minimized even if ΔTld is not varied up to its limit, i.e., the threshold. As such the case, for example, there is a case in which the ambient temperature=55 degrees Celsius.

Therefore, the controller 3, in this step ST3, carries out both determination of whether ΔTld exceeds the allowable variation amount and determination of whether Tld has reached the ambient temperature.

Returning to the flow shown in FIG. 2, the controller 3 acquires the information about the laser driving current used for currently driving the semiconductor laser 5 from the laser drive circuit 2, and determines whether the acquired laser driving current information has reached a preset threshold (in step ST4).

At the time of "bringing Tld close to the ambient temperature as close as possible", it is necessary to take into consideration not only the center wavelength but also extinction ratio (the ratio of light emission and extinction). The controller, in step ST4, determines whether or Tld raised in step ST3 is appropriate, in consideration of this extinction ratio.

A control operation with reference to the monitor current is performed on the semiconductor laser 5 independently of the variation of Tld in such a way that the semiconductor laser emits light having fixed power. As a result, the efficiency of the optical output power with respect the current gets worse remarkably at high temperatures. The monitor current varies dependently on the amount of light emitted from the semiconductor laser 5, and has a value equal to the output optical power.

More specifically, even if the efficiency of the optical output power of the semiconductor laser 5 with respect to current gets worse remarkably at high temperatures, the laser drive circuit 2 continuously feeds the laser driving current in such a way that the semiconductor laser emits light having the target power. However, because there is a limit to the efficiency of the semiconductor laser 5, there is a case in which when the temperature becomes high too much, the extinction ratio cannot be provided adequately even though the light has certain power. Therefore, according to Embodiment 1 of the present invention, the threshold for the laser driving current is set in advance from distribution data of the semiconductor laser 5, or the like, and the controller 3 determines whether the laser driving current has reached this threshold, thereby determining whether the laser driving current becomes large too much because of the increase of Tld in step ST3.

Further, the controller, in this step ST4, can simultaneously perform a checking operation in such a way that the semiconductor laser 5 does not enter an overlighting state, and in such a way that the semiconductor laser 5 does not fall into a failed state.

When, in step ST4, determining that the laser driving current has reached the threshold (when "YES" in step ST4), the controller 3 lowers Tld in step ST5). More specifically, the controller determines that the laser driving current has become large too much because of the increase of Tld in step ST3, and then lowers Tld and lowers the laser driving current to less than the threshold.

When, in step ST4, determining that the laser driving current does not reach the threshold (when "NO" in step ST4), the controller 3 determines whether the output optical power has reached the preset threshold on the basis of the monitor current acquired from the semiconductor laser 5 (in step ST6). This process takes into consideration the characteristic of the optical output power, which must be noted, as well as the center wavelength and the extinction ratio, at the time of "bringing Tld close to the ambient temperature as much as possible."

When, in step ST6, determining that the output optical power has reached the threshold (when "YES" in step 6), the controller 3 determines that the semiconductor laser has not outputted the target power, and then lowers Tld (in step ST7) and repeats the process of step ST6.

When, in step ST6, determining that the output optical power does not reach the threshold (when "NO" in step ST6), the controller 3 determines that it has controlled Tld appropriately and ends the processing.

In contrast, when, determining that the temperature threshold, which has been determined to be either higher than or equal to, or lower than or equal to the threshold of step ST2, is not on the high-temperature side (when "NO" in step ST2), the controller 3 lowers Tld in such a way that Tld becomes equal to the ambient temperature or in such a way that a temperature ΔTld, by which the thermoelement 6 must heat the semiconductor laser, reaches a preset threshold (in step ST8).

The controller 3 determines whether the output optical power has decreased to a preset threshold on the basis of the monitor current acquired from the semiconductor laser 5 (in step ST9), and, when the output optical power has decreased to the preset threshold (when "YES" in step 9), raises Tld (in step ST10), and then repeats the process of step ST9 and, when the output optical power has not decreased to the preset threshold (when "NO" in step 9), ends the processing. Because these processes in steps ST8 and ST9 are opposite to those on the high temperature side (in steps ST3 and ST6), a detailed explanation of the processes will be omitted hereafter.

Because the control operation on the low temperature side improves the efficiency (the emitted light power with respect to the current flowing through the semiconductor laser 5) with respect to the control operation on the high temperature, it cannot be expected that the extinction ratio is too low to be provided adequately. Therefore, although in this embodiment the determination of whether the laser driving current has reached a threshold (which corresponds to the determination of step ST4 on the high temperature side) is omitted in the control operation on the low temperature side, the determination of whether the laser driving current has reached the threshold can be carried out in the control operation on the low temperature side, like in the case of the control operation on the high temperature side.

As previously explained with reference to FIG. 2, in Embodiment 1 of the present invention, the controller 3 takes into consideration the three characteristics including the center wavelength, the optical output power and the extinction ratio, and fundamentally performs the control operation of bringing Tld close to the ambient temperature in such a way that one of these characteristics reaches its upper limit.

As mentioned above, the optical transmitter according to this Embodiment 1 can approximately calculate the characteristics of the semiconductor laser from the monitor information, and automatically adjust Tld to an optimum value depending on the characteristics of the element (Tld that can minimize the current flowing through the thermoelement, and that can ensure the characteristics). More specifically, because the optical transmitter can bring Tld close to the ambient temperature as much as possible even when the operation ensuring temperature range thereof is shifted to high temperatures or low temperatures, the optical transmitter can optimize the current flowing through the thermoelement 6, and, as a result, can achieve low power consumption thereof.

Embodiment 2

Although in Embodiment 1 the optical transmitter dynamically varies Tld with a variation in ambient temperature, the optical transmitter can alternatively hold a look up table in a nonvolatile memory area of the controller and perform feed forward control on the processing shown in Embodiment 1.

Figure 3:
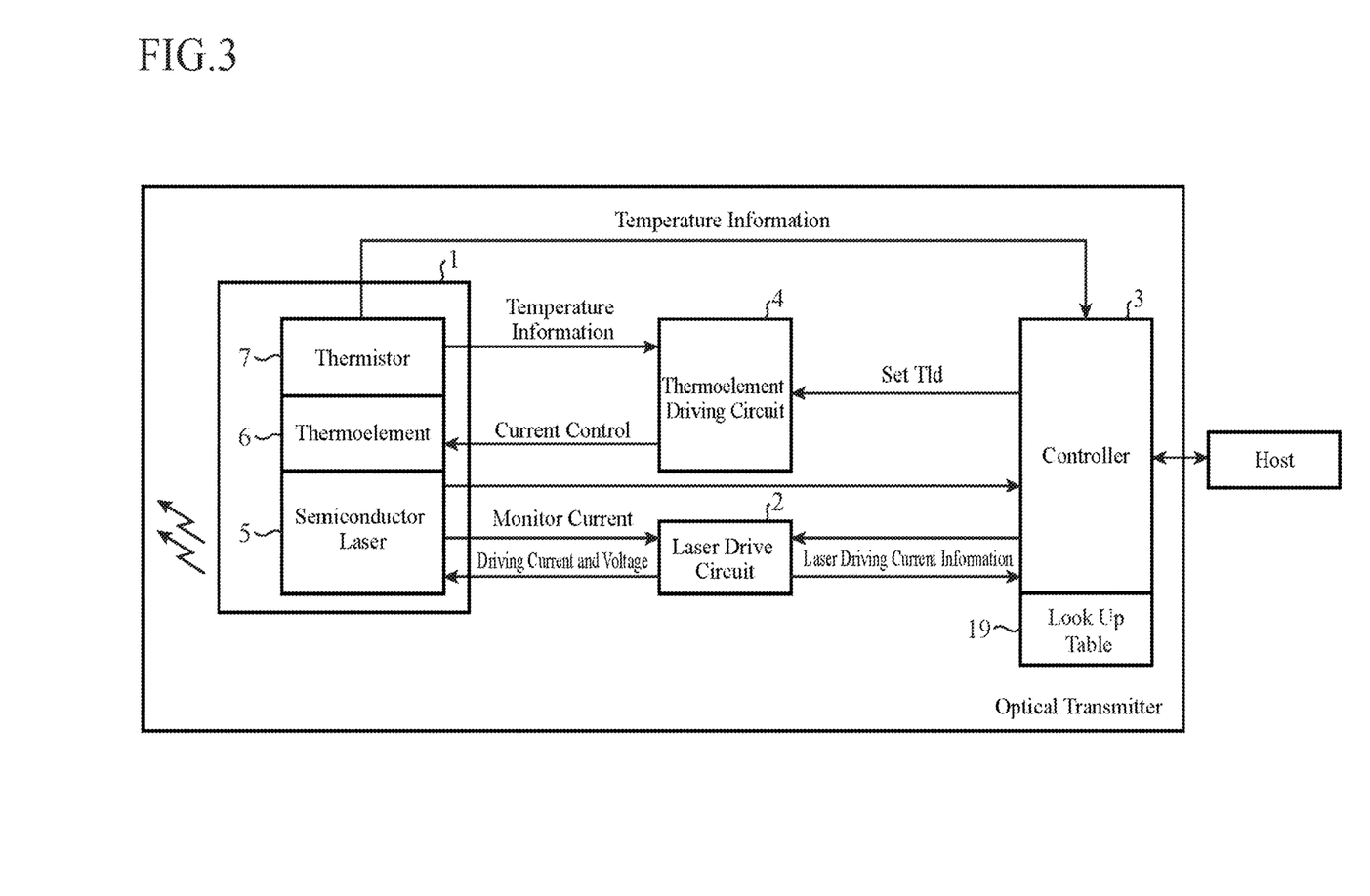
FIG. 3 is a block diagram of an optical transmitter according to Embodiment 2 of the present invention.

FIG. 3 is a block diagram of an optical transmitter according to Embodiment 2 of the present invention.

The same components as those explained in Embodiment 1 by using FIG. 1 are denoted by the same reference numerals, and a duplicated explanation of the components will be omitted hereafter.

As shown in FIG. 3, the optical transmitter according to Embodiment 2 of the present invention differs from that according to Embodiment 1 in that a controller 3 holds a look up table 19.

A relationship between ambient temperature, i.e., monitor temperature based on temperature information from a thermistor 7, and Tld is determined and recorded in advance in the look up table 19.

In this Embodiment 2, at the time of an adjustment to the temperature of the optical transmitter, the controller 3 refers to the look up table 19 by using the monitored temperature information, and sets Tld successively, in accordance with the flow explained with reference to FIG. 2 in Embodiment 1. More specifically, in the process in step ST3 of FIG. 2 or in the process in step ST8 of FIG. 2, the controller refers to the look up table 19 and, when raisin Tld or lowering Tld, sets Tld which is brought into correspondence with the ambient temperature.

The look up table 19 can be generated by performing temperature tests at the time of performing adjustment tests on the entire optical transmitter, and tablizing Tld for an optimal monitor temperature in advance.

Because other operations are the same as those explained using FIG. 2 in Embodiment 1, a detailed explanation of the other operations will be omitted hereafter.

As mentioned above, the optical transmitter according to this Embodiment 2 can approximately calculate the characteristics of the semiconductor laser from the monitor information, and automatically adjust Tld to an optimum value depending on the characteristics of the element (Tld that can minimize the current flowing through the thermoelement, and that can ensure the characteristics). More specifically, because the optical transmitter can bring Tld close to the ambient temperature as much as possible even when the operation ensuring temperature range thereof is shifted to high temperatures or low temperatures, the optical transmitter can optimize the current flowing through the thermoelement 6, and, as a result, can achieve low power consumption thereof. Further, because the optical transmitter performs the simple operation of varying Tld with reference to the table on the basis of the current monitor temperature, the complexity of the software can be reduced.

While the invention has been described in its preferred embodiments, it is to be understood that an arbitrary combination of two or more of the above-mentioned embodiments can be made, various varies can be made in an arbitrary component according to any one of the above-mentioned embodiments, and an arbitrary component according to any one of the above-mentioned embodiments can be omitted within the scope of the invention.

Further, each unit used for the control of the optical transmitter according to each of Embodiments 1 and 2 is implemented by program processing based on software and using a CPU.

INDUSTRIAL APPLICABILITY

Because the optical transmitter and the semiconductor laser temperature control method according to the present invention can adjust Tld to an optimum value for each semiconductor laser or for each operating condition, minimize the current flowing through the thermoelement and achieve low power consumption of an optical transmission and reception unit, they can be applied to an optical transmitter for and a semiconductor laser temperature control method of, in an optical transport system, controlling a heat conductive element that is disposed to keep a semiconductor laser a constant temperature and represented by a Peltier device, and that heats or cools the semiconductor laser by using a current, and so on.

REFERENCE SIGNS LIST

1 semiconductor laser unit, 2 laser drive circuit, 3 controller, 4 thermoelement driving circuit, 5 semiconductor laser, 6 thermoelement, 7 thermistor, and 19 look up table.

The invention claimed is:

1. An optical transmitter comprising:
   a semiconductor laser;
   a thermoelement connected with said semiconductor laser, to heat or cool said semiconductor laser with heat generated or cooled by a current;
   a thermistor to detect temperature of said semiconductor laser via said thermoelement;
   a laser drive circuit to drive said semiconductor laser;
   a thermoelement driving circuit to acquire information about the temperature from said thermistor, receive a set value, and control a current flowing through said thermoelement in such a way that the information about the temperature detected by said thermistor becomes equal to the set value; and
   a controller to receive monitor current information from the semiconductor laser, temperature information from the thermistor, and laser driving current information from the laser drive circuit,
   wherein when a monitor temperature based on the temperature information from the thermistor has become higher than or equal to a preset first threshold on a high temperature side of a temperature threshold of the set value, the controller raises the set value in such a way that the set value becomes equal to the temperature detected by the thermistor or in such a way that a temperature by which the semiconductor laser needs to be cooled by the thermoelement reached a preset second threshold,
   when a laser driving current based on the laser driving current information has become larger than or equal to a preset third threshold due to an increase in the set value, the controller corrects the set value so as to lower the set value,
   when optical output power based on the monitor current information has become larger than or equal to a preset fourth threshold, the controller corrects and varies the set value after the correction so as to lower the set value,
   when the monitor temperature based on the temperature information from the thermistor has become lower than or equal to a preset fifth threshold on a low temperature side of a temperature threshold of the set value, the controller lowers the set value in such a way that the set value becomes equal to the temperature detected by the thermistor or in such a way that a temperature by which the semiconductor laser needs to be heated by the thermoelement reaches a preset sixth threshold, and
   when the optical output power based on the monitor current information has become smaller than or equal to a preset seventh threshold do to a decrease in the set value, the controller corrects and varies the set value so as to raise the set value.

2. The optical transmitter according to claim 1, wherein said controller holds a table in which a correspondence between the temperature detected by said thermistor and said set value is stored, and refers to said table when varying said set value.

3. An optical transmitter comprising:
   a semiconductor laser;
   a thermoelement connected with said semiconductor laser, to heat or cool said semiconductor laser with heat generated or cooled by a current;
   a thermistor to detect temperature of said semiconductor laser via said thermoelement;
   a laser drive circuit to drive said semiconductor laser;
   a thermoelement driving circuit to acquire information about the temperature from said thermistor, receive a set value, and control a current flowing through said thermoelement in such a way that the information about the temperature detected by said thermistor becomes equal to the set value; and
   a controller to receive monitor current information from the semiconductor laser, temperature information from the thermistor, laser driving current information from the laser drive circuit, and hold a table in which the temperature detected by the thermistor and the set value are associated with each other,
   wherein when a monitor temperature based on temperature information from the thermistor has become higher than or equal to a preset first threshold on a high temperature side of a temperature threshold of the set value, the controller changes the set value on a basis of the table,
   when a laser driving current based on the laser driving current information has become larger than or equal to a preset third threshold due to the change in the set value, the controller corrects the set value so as to lower the set value,
   when optical output power based on the monitor current information has become larger than or equal to a preset fourth threshold, the controller corrects and varies the set value after the correction so as to lower the set value,
   when the monitor temperature based on the temperature information from the thermistor has become lower than or equal to a preset fifth threshold on a low temperature side of a temperature threshold of the set value, the controller changes the set value on the basis of the table, and
   when the optical output power based on the monitor current information has become smaller than or equal to a preset seventh threshold due to a change in the set value, the controller corrects and varies the set value so as to raise the set value.

4. A semiconductor laser temperature control method for use in an optical transmitter including a semiconductor laser, a thermoelement connected with said semiconductor laser to heat or cool said semiconductor laser with heat generated or cooled by a current, a thermistor to detect temperature of said semiconductor laser via said thermoelement, and a laser drive circuit to drive said semiconductor laser, said semiconductor laser temperature control method comprising:
   in a thermoelement driving circuit, acquiring information about the temperature from said thermistor, receiving a set value, and controlling a current flowing through said thermoelement in such a way that the temperature detected by said thermistor becomes equal to the set value; and in a controller, when a monitor temperature based on the temperature information from the thermistor has become higher than or equal to a preset first threshold on a high temperature side of a temperature threshold of the set value, raising the set value in such a way that the set value becomes equal to the temperature detected by the thermistor or in such a way that a temperature by which the semiconductor laser needs to be cooled by the thermoelement reaches a preset second threshold;

when a laser driving current based on the laser driving current information has become larger than or equal to a preset third threshold due to an increase in the set value, correcting the set value so as to lower the set value;

when optical output power based on the monitor current information has become larger than or equal to a preset fourth threshold, correcting and varying the set value after the correction so as to lower the set value;

when the monitor temperature based on the temperature information from the thermistor has become lower than or equal to a preset fifth threshold on a low temperature side of a temperature threshold of the set value, lowering the set value in such a way that the set value becomes equal to the temperature detected by the thermistor or in such a way that a temperature by which the semiconductor laser needs to be heated by the thermoelement reaches a preset sixth threshold, and when the optical output power based on the monitor current information has become smaller than or equal to a preset seventh threshold due to a decrease in the set value, correcting and varying the set value so as to raise the set value.

* * * * *